(12) United States Patent (10) Patent No.: US 12,550,688 B2
Shackleton et al. (45) Date of Patent: Feb. 10, 2026

(54) PLANARIZATION PROCESS, APPARATUS AND METHOD OF MANUFACTURING AN ARTICLE

(71) Applicant: CANON KABUSHIKI KAISHA, Tokyo (JP)

(72) Inventors: Steven C. Shackleton, Austin, TX (US); Seth J. Bamesberger, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 813 days.

(21) Appl. No.: 17/564,710

(22) Filed: Dec. 29, 2021

(65) Prior Publication Data

US 2023/0207326 A1    Jun. 29, 2023

(51) Int. Cl.
*H01L 21/3105* (2006.01)
*H01L 21/304* (2006.01)
*H01L 21/683* (2006.01)
*H01L 21/687* (2006.01)

(52) U.S. Cl.
CPC .... *H01L 21/31051* (2013.01); *H01L 21/6831* (2013.01); *H01L 21/6838* (2013.01); *H01L 21/68728* (2013.01); *H01L 21/68735* (2013.01); *H01L 21/304* (2013.01)

(58) Field of Classification Search
None
See application file for complete search history.

(56) References Cited

U.S. PATENT DOCUMENTS

| | | |
|---|---|---|
| 5,266,527 A | 11/1993 | Robbins |
| 6,460,414 B1 | 10/2002 | Erickson et al. |
| 6,531,686 B2 | 3/2003 | Park |
| 7,670,530 B2 | 3/2010 | Choi et al. |
| 8,973,495 B2 | 3/2015 | Kasumi et al. |
| 2006/0172553 A1 | 8/2006 | Choi |
| 2007/0170617 A1 | 7/2007 | Choi |
| 2007/0289124 A1* | 12/2007 | Oh ............... H01L 21/6838 29/729 |
| 2009/0044751 A1 | 2/2009 | Park et al. |
| 2009/0124067 A1 | 5/2009 | Contes et al. |
| 2010/0031833 A1* | 2/2010 | Kasumi ............ G03F 7/0002 101/4 |
| 2011/0318906 A1* | 12/2011 | Chida ............. H01L 21/68735 257/E21.237 |
| 2012/0319326 A1 | 12/2012 | Shiraishi et al. |
| 2015/0091230 A1* | 4/2015 | GanapathiSubramanian ........... G03F 7/0002 269/21 |
| 2017/0178931 A1* | 6/2017 | Choi ............... H01L 21/68735 |
| 2017/0345702 A1* | 11/2017 | Iwabuchi ......... H01L 21/6875 |

FOREIGN PATENT DOCUMENTS

| | | |
|---|---|---|
| JP | 2007073832 A | 3/2007 |
| JP | 2010269580 A | 12/2010 |
| JP | 2020072241 A | 5/2020 |

(Continued)

*Primary Examiner* — Binu Thomas
(74) *Attorney, Agent, or Firm* — Canon U.S.A., Inc. IP Division

(57) ABSTRACT

A planarization system is provided. The planarization system includes a first substrate chuck which holds the substrate during a planarization step, and a second substrate chuck which holds the substrate with a non-flat configuration during a separation step.

22 Claims, 8 Drawing Sheets

(56) References Cited

FOREIGN PATENT DOCUMENTS

| | | |
|---|---|---|
| JP | 2021015912 A | 2/2021 |
| KR | 20020035594 A | 5/2002 |
| KR | 20120039552 A | 4/2012 |
| KR | 20200018265 A | 2/2020 |
| TW | 201103721 A | 2/2011 |
| TW | 202109735 A | 3/2021 |

* cited by examiner

PLANARIZATION PROCESS, APPARATUS AND METHOD OF MANUFACTURING AN ARTICLE

BACKGROUND

Field of Art

The present disclosure relates to planarization process, and more particularly, to a planarization chuck and a separation chuck.

Description of the Related Art

Planarization techniques are useful in fabricating semiconductor devices. For example, the process for creating a semiconductor device includes repeatedly adding and removing material to and from a substrate producing a layered substrate with an irregular height variation (topography). As more layers are added to the substrate height variation increases. The height variation has a negative impact on the ability to add additional layers to the layered substrate. Separately, semiconductor substrates (e.g., silicon wafer) themselves are not always perfectly flat and may include initial surface height variation (topography). On method of addressing this issue is to planarize the substrate. Various lithographic patterning methods benefit from patterning a planar surface. In ArFi laser-based lithography, planarization improves depth of focus (DOF), critical dimension (CD), and critical dimension uniformity. In extreme ultraviolet lithography (EUV), planarization improves feature placement and DOF. In nanoimprint lithography (NIL) planarization improves feature filling and CD control after pattern transfer.

A planarization technique sometimes referred to as inkjet-based adaptive planarization (IAP) includes dispensing a variable drop pattern of polymerizable material between the substrate and a superstrate, where the drop pattern varies depending on the substrate topography. The superstrate is brought into contact with the polymerizable material after which the material is polymerized on the substrate, and the superstrate removed. Improvements in planarization techniques are desired for improving, e.g., whole wafer processing and semiconductor device fabrication.

SUMMARY

A planarization system is provided. The planarization system includes a first substrate chuck configured to hold a substrate used during a planarization step and a second substratechuck configured to hold the substrate used during a separation step. During the separation step, the second wafer chuck is configured to hold the substrate with a non-flat configuration. The first substrate chuck may include a plurality of contact points to be in contact with a wafer to be held by the first substrate chuck. The first substrate chuck may have a global flatness no larger than 50 nm across the plurality of contact points. During the planarization step, the first substrate chuck is configured to maintain a flatness of the wafer while minimizing backside contact area during planarization step. The first wafer chuck may be made of $Al_2O_3$, SiC, Sapphire, or ceramics materials.

The second substrate chuck may be made of a compliant material. The first substrate chuck may have a diameter no smaller than a diameter of the wafer to support the wafer from edge to edge during planarization. The second substrate chuck may have a diameter smaller than a diameter of the wafer. The second substrate chuck may be configured to maximize a holding force at an edge of the wafer during the separation step. In one embodiment, the second substrate chuck may include a predetermined number of pins and lands, and each of the pins and lands has a geometry and a surface area predetermined for separation. Alternatively, the second substrate chuck has a dome or cylindrical shape at a contact side which is to be in contact with the wafer. The second substrate chuck may be more flexible than the first wafer chuck. The second substrate chuck may have a thickness largest at a center thereof and thinnest at a periphery thereof. The second substrate chuck may have a surface to be in contact with the wafer, the surface has a sequence of steps with gradually decreasing heights from a center of the second wafer chuck. The second substrate chuck may include a recessed center, a first land, a recessed ring, and a second land arranged from a center to a periphery thereof in another embodiment.

The planarization system may further comprise a rotary stage on which the first substrate chuck and the second substrate chuck rotate to align with a planarization head, respectively. The rotary stage may include a three-position rotary stage configured to carry and rotate the first substrate chuck, the substrate wafer chuck, and a superstrate loading chuck on a plane. The first substrate chuck, the second substrate chuck, and the superstrate chuck may be arranged in a triangle on the plane. Alternatively, the planarization system may include a linear stage on which the first substrate chuck and the second substrate chuck move linearly to align with the planarization head, respectively.

A method is provided. The method includes holding a substrate on a first substrate chuck; bringing a material on the substrate held by the first substrate chuck into contact with a planarization plate; moving the substrate and the planarization plate contacting with each other to a second substrate chuck from the first substrate chuck; and separating the planarization plate from the material on the substrate held by the second substrate chuck. In one embodiment, another substrate is held on the first substrate chuck during the moving or the separating.

A method of manufacturing an article is provided. A material is applied on a substrate. The substrate is held by a first substrate chuck. The material on the substrate held by the first wafer chuck is brought into contact with a planarization plate. The substrate and the planarization plate in contact each other are moved to a second substrate chuck from the first substrate chuck. The planarization plate is separated from the material on the substrate held by the second substrate chuck, and the substrate is processed to manufacture the article.

A planarization system is provided. The planarization system comprises a first substrate chuck configured to hold a substrate, a second substrate configured to hold the substrate, a stage configured to move the first substrate and the second substrate, a planarization head configured to hold a planarization plate, and a control unit configured to control the stage and the planarization head. The planarization head brings the planarization plate into contact with a material on the substrate held by the first substrate chuck. The planarization head may hold the substrate and the planarization plate in contact with each other to move to the substrate and the planarization plate from the first substrate chuck by the stage. The planarization head may then separate the planarization plate from the material on the substrate held by the second substrate chuck.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

Figure 1:
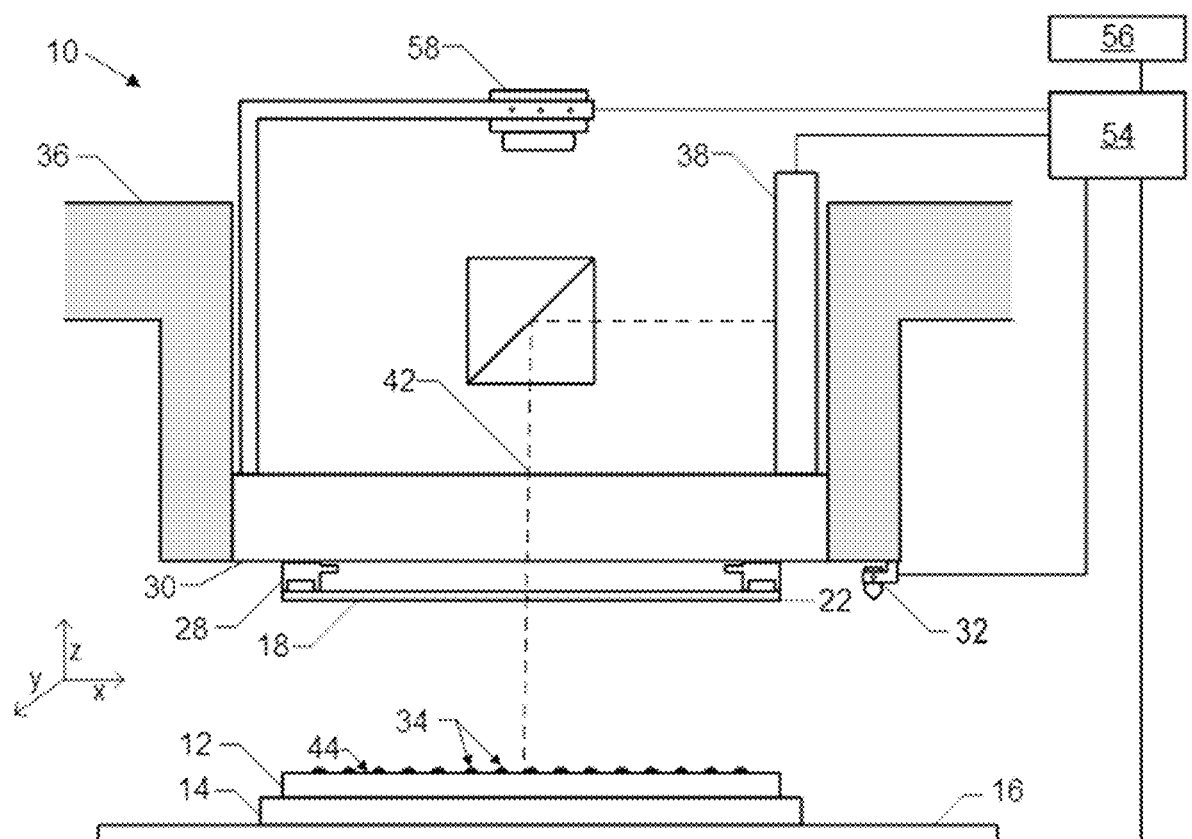
FIG. 1 is a diagram illustrating a planarization system.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

Planarization System

FIG. 1 illustrates a planarization system 10 in which an embodiment may be implemented. The system 10 may be used to form a relief pattern on a substrate 12. The substrate 12 may be coupled to a substrate chuck 14. As illustrated, the substrate chuck 14 is a vacuum chuck. The substrate chuck 14, however, may be any chuck including, but not limited to, vacuum, pin-type, groove-type, electrostatic, electromagnetic, and/or the like.

The substrate 12 and the substrate chuck 14 may be further supported by a positioning stage 16. The stage 16 may provide translational and/or rotational motion along one or more of the x, y, z, θ, and ϕ axes. The stage 16, the substrate 12, and the substrate chuck 14 may also be positioned on a base (not shown). Spaced-apart from the substrate 12 is a template 18. The template 18 may be formed from such materials including, but not limited to, fused-silica, quartz, silicon, organic polymers, siloxane polymers, borosilicate glass, fluorocarbon polymers, metal, hardened sapphire, and/or the like. A surface 22 may be blank, i.e. without pattern features, in which case a planar surface can be formed on the substrate or alternatively, the surface 22 may comprise features to define any original pattern that forms the basis of a pattern to be formed on the substrate 12. In an alternative embodiment, when the surface 22 is of the same areal size as the substrate 12, a layer can be formed over the entire substrate 12 (e.g., whole substrate processing).

The template 18 (superstrate 18 in the form of a flat member or a planarization plate with a flat surface) may be coupled to a template chuck 28 (superstrate chuck 28). The template chuck 28 may be configured as, but not limited to, vacuum, pin-type, groove-type, electrostatic, electromagnetic, and/or other similar chuck types. Further, the template chuck 28 may be coupled to a planarization head 30 which in turn may be moveably coupled to bridge 36 such that the template chuck 28, the head 30 and the template 18 are moveable in at least the z-axis direction.

The system 10 may further comprise a fluid dispense system 32. The fluid dispense system 32 may be used to deposit formable material 34 (e.g., polymerizable material) on the substrate 12. The formable material 34 may be positioned upon substrate 12 using techniques such as drop dispense, spin-coating, dip coating, chemical vapor deposition (CVD), physical vapor deposition (PVD), thin film deposition, thick film deposition, and/or the like. The formable material 34 may be disposed upon the substrate 12 before and/or after a desired volume is defined between the template 18 and the substrate 12 depending on design considerations.

The fluid dispense system 32 may use different technologies to dispense the formable material 34. When the formable material 34 is capable of jetting, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The system 10 may further comprise radiation source 38 that directs actinic energy 40 along path 42. The head 30 and the stage 16 may be configured to position the template 18 and substrate 12 in superimposition with path 42. Camera 58 may likewise be positioned in superimposition with path 42. The system 10 may be regulated by processor 54 in communication with the stage 16, head 30, fluid dispense system 32, source 38, and/or camera 58 and may operate on a computer readable program stored in memory 56.

Either the head 30, stage 16, or both vary a distance between the template 18 and substrate 12 to define a desired volume therebetween that is filled by formable material 34. For example, the head 30 may apply a force to template 18 such that the template 18 contacts the formable material 34. After the desired volume is filled with the formable material 34, source 38 produces the actinic energy 40 (e.g., ultraviolet radiation) causing the formable material 34 to solidify and/or cross-link conforming to a shape of a surface 44 of the substrate 12 and the surface 22 of the template 18, defining a formed layer on the substrate 12.

Planarization Process

Figure 2A:
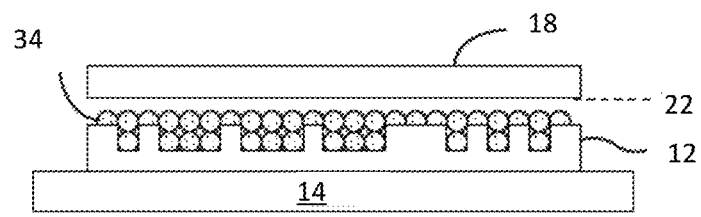
FIGS. 2A to 2C illustrate a planarization process.
Figure 2B:
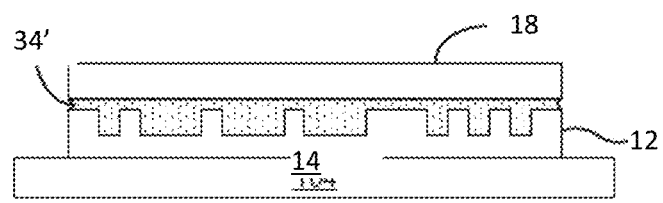
Figure 2C:
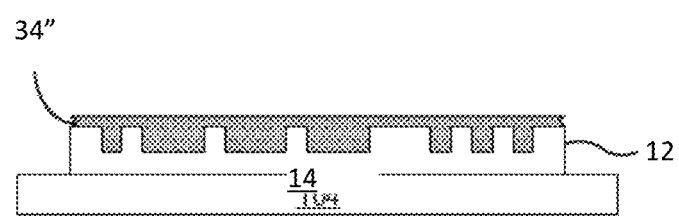

The planarization process includes steps which are shown schematically in FIGS. 2A to FIG. 2C which may make use of the system 10 configured to perform the planarization process. As illustrated in FIG. 2A, the formable material 34 in the form of droplets is dispensed onto the substrate 12. As discussed previously, the substrate surface has some topography which may be known based on previous processing operations or may be measured using a profilometer, AFM, SEM, or an optical surface profiler based on optical interference effect like Zygo NewView 8200. The local volume density of the deposited formable material 34 is varied depending on the substrate topography. The superstrate 18 is then positioned in contact with the formable material 34. As used herein, template and superstrate are used interchangeably to describe an object with a shaping surface that is brought into contact with the formable material to control the shape of the formable material. As used herein, template chuck and superstrate chuck are used interchangeably to hold the template or the superstrate.

FIG. 2B illustrates a post-contact step after the superstrate 18 has been brought into full contact with the formable material 34 but before a polymerization process starts. The superstrate 18 is equivalent to the template 18 in FIG. 1 and is substantially featureless (may include alignment or identification features) and may be substantially the same size and shape as the substrate (a characteristic dimension such as average diameter of the superstrate may be within at least 3% of a characteristic dimension of the substrate). As the superstrate 18 contacts the formable material 34, the droplets merge to form a formable material film 34' that fills the space between the superstrate 18 and the substrate 12. Preferably, the filling process happens in a uniform manner without any air or gas bubbles being trapped between the superstrate 18 and the substrate 12 in order to minimize non-fill defects. The polymerization process or curing of the formable material 34 may be initiated with actinic radiation (e.g., UV radiation). For example, radiation source 58 of FIG. 1 can provide the actinic radiation causing formable material film 34' to cure, solidify, and/or cross-link, defining a cured planarized layer on the substrate 12. Alternatively, curing of the formable material film 34' can also be initiated by using heat, pressure, chemical reaction, other types of radiation, or any combination of these. Once cured, planarized layer 34" is formed, the superstrate 18 can be separated therefrom. FIG. 2C illustrates the cured planarized layer 34" on the substrate 12 after separation of the superstrate 18.

Wafer Chuck

The planarization apparatus as shown in FIG. 1 includes a substrate chuck 14 (a wafer chuck) for holding the substrate (e.g., wafer) 12. A common wafer chuck 14 has previously been used for both planarization and separation in the planarization process. For example, as shown in FIGS. 2A to 2C, the same wafer chuck 14 is used during both the planarization process and the separation process. During planarization, a rigid flat wafer chuck is needed to achieve desired level of uniformity. However, such geometry and constraint of the wafer limits the techniques that can be used for separation of the superstrate 18 from the planarized layer 34" on the wafer 12. Having a common chuck used for both planarization and separation is also a bottleneck to throughput because it must be occupied for two steps. To resolve the issues created for using a common chuck for both planarization and separation, use of two different chucks for planarization and separation respectively is proposed. These chucks can be located on a common platform or separate motion platforms, and each can be designed with different features tailored for their respective purposes. As a result, throughput and quality can be improved because planarization, separation, and wafer handling steps can be performed in parallel. As used herein wafer and substrate are used interchangeably to describe the workpiece on which the formable material is shaped by the superstrate and/or template. The wafer may be made semiconductor, metal, a dielectric, or a composite material. The wafer maybe crystalline or glass like.

For planarization, a wafer chuck, for example, a pin-type chuck is required to provide sufficient support to maintain a flat wafer while minimizing back side contact area. For example, the backside contact is preferably controlled between 0.5% to 5%. The global flatness is preferably controlled to about 50 nm. The material for forming the chuck is preferably hard and stiff enough to create a durable, flat wafer surface. For example, material such as $Al_2O_3$, SiC, sapphire, and other ceramics may be used to form the planarization chuck. The hardness may be controlled to be larger than Rockwell C 60 or Vickers Hardness 746. A complete support from edge to edge of the wafer is required. The planarization wafer chuck may include an outer land with a diameter of about 295 mm to about 298 mm for a 300 mm diameter wafer.

For separating the superstrate from the wafer, a holding force at an edge of the wafer may be required to promote crack initiation. The geometry of the separation wafer chuck may also be configured to promote peeling of the wafer from the superstrate. The separation wafer chuck for separation does not need to be flat. On the contrary, it may be compliant or have features that are configured to hold the wafer of the sandwich in a non-flat or curved configuration. That is, during the separation, the wafer held by the separation wafer chuck may be bent or curved due to the compliant feature of the separation wafer chuck. The separation wafer chuck can intentionally bend the sandwich and/or wafer of the sandwich or increases the curvature of the sandwich of the superstrate and the wafer for separation. The separation wafer chuck does not have to fully support the wafer or sandwich. Instead, the wafer or sandwich may be cantilevered off the chuck and the chuck may act as a separate actuator to separate the wafer from the superstrate. Pin and land geometry and surface area of the separation wafer chuck may be designed to vary uniformity and density to optimize separation mechanism. FIGS. 3A to 3E show various exemplary geometries of the chuck that may be used for separation.

Figure 3A:
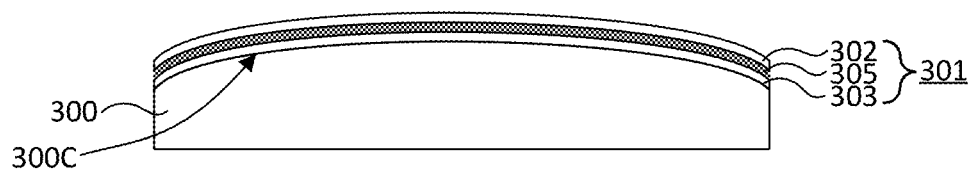
FIGS. 3A to 3E are cross-sectional views showing variable configurations of separation wafer chucks.
Figure 3B:
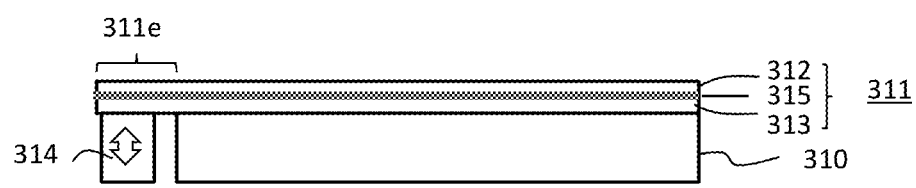
Figure 3C:
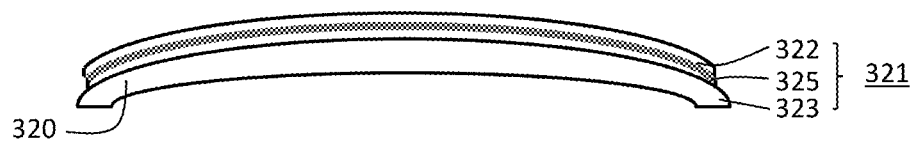
Figure 3D:
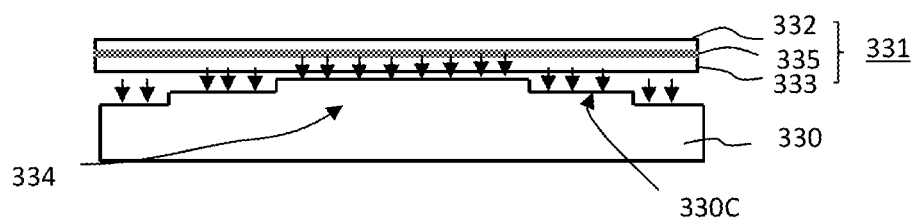
Figure 3E:
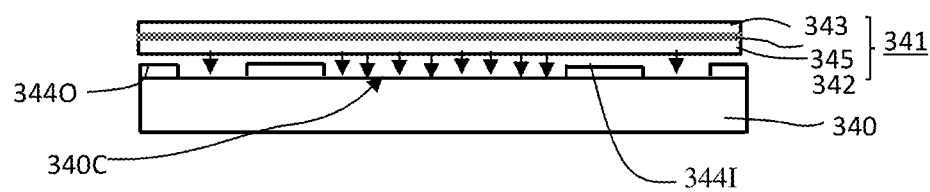

FIG. 3A shows a separation wafer chuck 300 with a domed or partial cylindrical shaped contact side 300C. After planarization, the sandwich 301 of the wafer (substrate) 303, the and the superstrate 302 (and a planarized layer 305 such as the layer 34" as shown in FIG. 2C) allows a planarization head (PH) chuck (not shown but equivalent to the head 30) to conform to the separation wafer chuck 300 and to apply pressure for separating the superstrate 302 from the planarized layer 34" on the wafer 303. A dome contact side 300C may have a radius of curvature that is radially symmetric. The cylindrical contact side 300C may have a radius of curvature along one axis and substantially no curvature along a second axis orthogonal to the first axis. FIG. 3B shows a cross section of a separation wafer chuck 310 with a diameter smaller than the diameter of a sandwich 311 of a wafer 313, a planarized layer 315, and a superstrate 312. The sandwich 311 has an overhanging edge portion 311e such that an actuator 314 may be positioned under the overhanging edge portion 311e to actuate separation of the planarized layer 315 on the wafer 313 and the superstrate 312. In FIG. 3C, the separation wafer chuck 320 is made of compliant or flexible material to work in tandem with a planarization head chuck (not shown). That is, during separation, the flexible wafer chuck 320 is conformal to the flexible superstrate chuck (equivalent to the template chuck 28) to retain and to remove the superstrate 322 from the planarized layer 325 on the wafer 323. In the embodiment as shown in FIG. 3C, the diameter of the sandwich 321 of the superstrate 323; the planarized layer 325; and the wafer 323 may be less than the diameter of the flexible wafer chuck 320. FIG. 3D shows a flat separation wafer chuck 330 including a step-like structure 334 at the contact side 330C of thereof. In the example as shown in FIG. 3D, the step-like structure of the lands on the chuck have multiple steps with thicknesses that gradually are reduced from a center towards an edge of the separation wafer chuck 330 which can hold a sandwich 331 of the wafer 333; the planarized layer 335; and the superstrate 332. An important aspect of the step-like structure 334 is that the chuck includes a plurality of lands which may take the form of a series of concentric ring type lands. As the radius of the rings increase the top surface of the lands decrease which allows the sandwich to have a curved shape when vacuum is applied. In an alternative embodiment, the ring type lands are replaced with a plurality of discrete lands in which the top surfaces of the lands decrease as function of distance from the center of the separation chuck 330 which allows the sandwich to have a curved shape when vacuum is applied. The separation wafer chuck 330 is equipped with a vacuum source applying vacuum indicated by the arrows in FIG. 3D. In FIG. 3E, the separation wafer chuck 340 includes multiple lands 344 at the contact side 340C to result in a donut shape in a top view of the separation wafer chuck 340. As shown in FIG. 3E, the central portion of the separation wafer chuck 340 is recessed from the inner land 344I. The inner land 344I and the outer land 344O define a peripheral ring portion recessed from both the inner land 344I and the outer land 344O. In an embodiment, the outer land 344O is recessed relative to the inner land 344I. During separation, a vacuum is applied to push the edges of sandwich 341 of the superstrate 343; the planarized layer 345; and the substrate 342 towards the separation wafer chuck 340.

Figure 4:
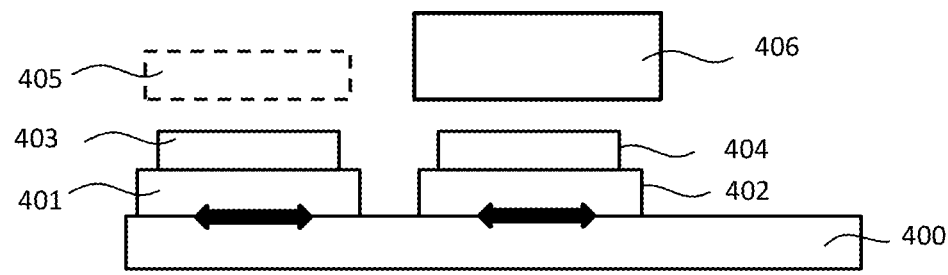
FIG. 4 shows a linear stage for supporting the planarization wafer chuck and the separation wafer chuck.

The planarization wafer chuck and the separation wafer chuck may be supported by a common stage base. The common stage base may have a linear stage configuration which allows the planarization wafer chuck and the separation wafer chuck to move linearly on the common stage base. FIG. 4 shows an embodiment of a linear stage base 400 for carrying and supporting the planarization wafer chuck 403 and the separation wafer chuck 404 on a linear stage. The planarization wafer chuck 403 is supported by a planarization chuck carriage 401, and the separation wafer chuck 404 is supported by a separation chuck carriage 402. Both the planarization chuck carriage 403 and the separation chuck carriage 404 are supported by and movable linearly on the common stage base 400. An optional UV light source, for example, a UV LED array 405 may be arranged over one side of the stage base 400. A planarization head 406 is arranged above a center of the stage base 400. The planarization chuck 403 carried by the planarization chuck carriage 401 is moveable between a position aligned with the optional UV LED source 405 and a position aligned with the planarization head 406. The separation chuck 404 carried by the separation chuck carriage 402 moves between the center position aligned with the planarization head 406 and a position at another side of the stage base 400. The planarization head 406 may include a superstrate chuck similar to the superstrate chuck 28 as shown in FIG. 1.

Figure 5A:
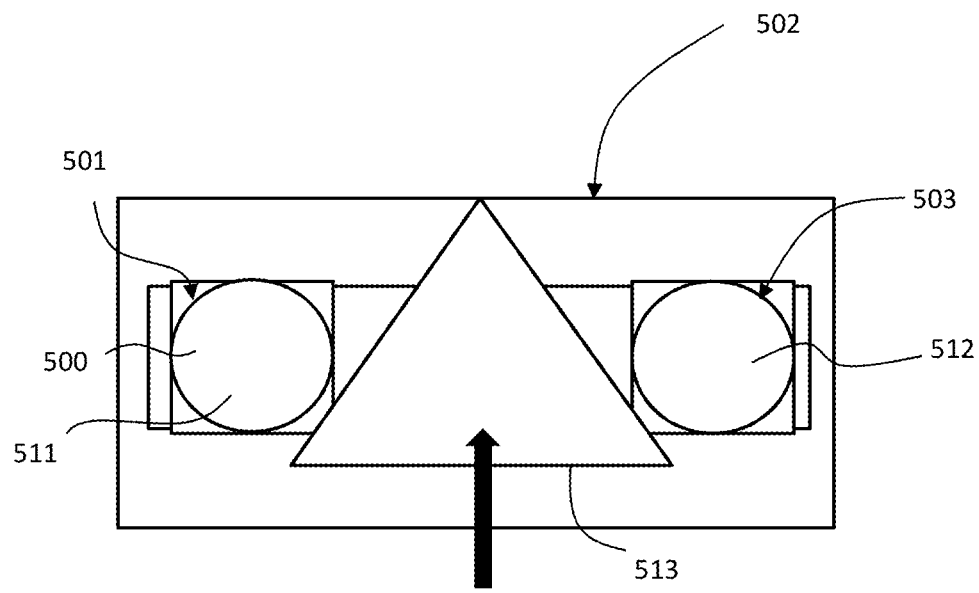
FIGS. 5A to 5C shows the positions of the planarization wafer chuck and the separation wafer chuck for planarization and separation operations.
Figure 5B:
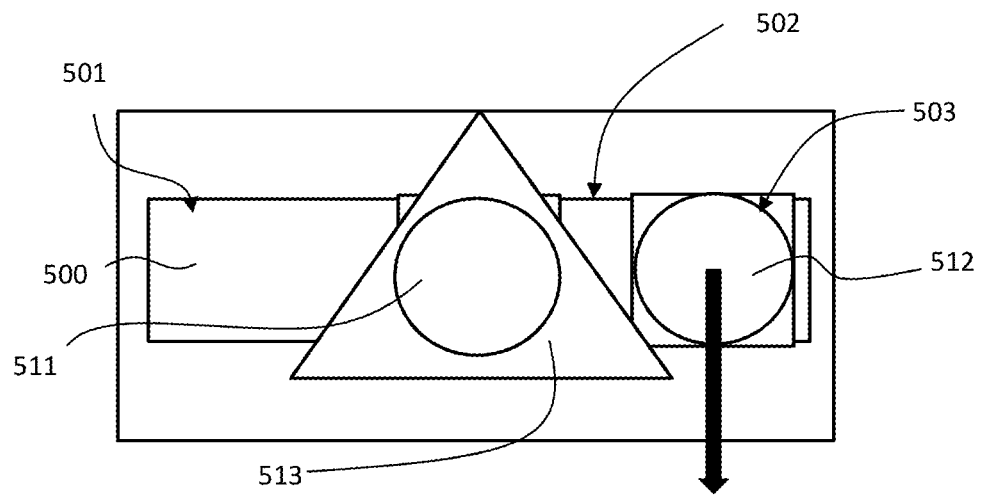
Figure 5C:
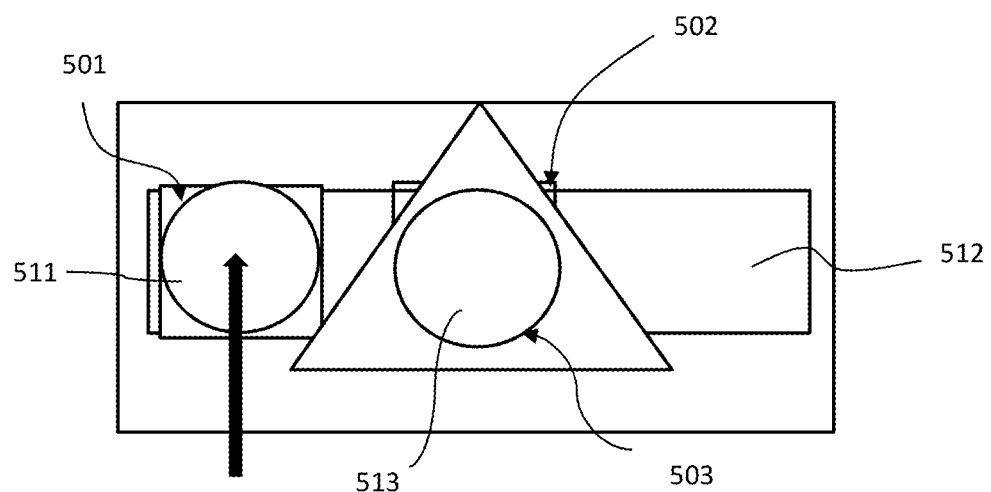

FIGS. 5A to 5C are top views showing a three-position linear stage 500 for supporting a planarization wafer chuck 511 and a separation wafer chuck 512. Three zones are defined along an elongate direction on the linear stage 500, including a planarization chuck loading zone 501, a separation loading zone 503, and a superstrate chuck loading zone 502 between the planarization chuck loading zone 501 and the separation chuck loading zone 503. Similar to the embodiment as shown in FIG. 4, an optional UV LED source may be installed on top of the planarization chuck loading zone 501. A substrate 12 may be loaded onto the planarization chuck in the planarization chuck loading zone 501. As shown in FIG. 5A, the planarization chuck 511 is loaded in the planarization chuck loading zone 501. The planarization head 513 (equivalent to the head 30 as shown in FIG. 1) is placed above the superstrate chuck loading zone 502, and a superstrate chuck (equivalent to the template chuck 28 as shown in FIG. 1) may be loaded with a superstrate 18 in a similar manner as shown in FIG. 1 at the superstrate loading zone 502. The separation chuck 512 is loaded with a sandwich (wafer; planarized layer; and superstrate) by the planarization head PH: removing the sandwich from the planarization chuck 500 while the planarization chuck 500 is under the planarization head; retaining the sandwich until the separation chuck 512 is under the planarization head PH; and loading the sandwich onto the separation chuck 512. UV radiation may be applied to a wafer carried by the planarization chuck 511 located at the planarization chuck loading zone 501. A UV radiation source may also be installed in the planarization head to apply UV exposure to the wafer. To perform planarization, a superstrate is loaded onto a superstrate chuck. A wafer with dispensed formable material is loaded onto the planarization chuck 511 at the planarization chuck loading zone 501. The planarization chuck 511 is moved under the planarization head PH to start the fluid spreading. The superstrate is then released from the planarization head to complete fluid spreading and the formable material film is cured under the planarization head (PH) at the superstrate loading zone 502 as shown in FIG. 5B. The formable material may also be exposed to UV radiation while being moved to the planarization chuck loading zone 501. After planarization process, the sandwich (wafer; planarized layer; and superstrate) is decoupled from the planarization chuck 511 with the superstrate chuck attached to the planarization head. The planarization chuck 511 is moved away from the superstrate loading zone 502, and a separation chuck 512 moves to the superstrate loading zone 502 as shown in FIG. 5C to retain the wafer and to separate the superstrate from the planarized layer on the wafer. Once separation is complete, the separation chuck 512 moves to the separation chuck unloading zone 503 where the wafer with the planarized layer may be unloaded from the linear stage 500.

Figure 6:
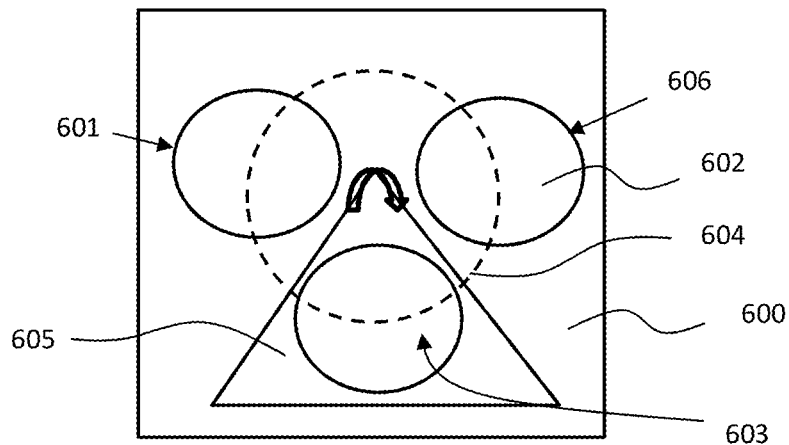
FIG. 6 shows a rotary stage for supporting the planarization wafer chuck and the separation wafer chuck.

In addition to the linear stage configuration, the common stage may have a rotatory stage configuration which allows the planarization wafer chuck and the separation wafer chuck to rotate on the common stage base. FIG. 6 shows an embodiment of a stage base 600 including a rotary track or rotary dish 604 to carry and rotate for supporting a planarization wafer chuck 601, a separation wafer chuck 602, and a superstrate loading station 603 at three zones along a periphery thereof. The superstrate chuck loading station 603 may be a station that is optimized for the loading of a superstrate 18 by a wafer handling robot onto the superstrate chuck attached to the planarization head 605. The superstrate loading station 603 may include extra space for the wafer handling robot to have access to the superstrate chuck. The superstrate chuck loading station 603 may include a superstrate loading chuck that has lifting pins on which a superstrate 18 is loaded by a wafer handling robot, the lifting pins of the superstrate chuck loading station 603 may then raise the superstrate 18 towards a superstrate chuck attached to the planarization head 605. When the superstrate chuck loading station 603 has a superstrate loading chuck lifting pins then the superstrate may be loaded onto the superstrate loading chuck when the superstrate loading chuck is not beneath the planarization head. An optional UV light source, for example, a UV LED 606 may be arranged over one of the zones as shown in FIG. 6. A planarization head 605 may be arranged to be on top of each of the planarization wafer chuck 601, the separation wafer chuck 602, and the superstrate loading station 603. The center of the planarization head 60 is located at or near a point on a circumference of a circle that intersects with centers of the planarization wafer chuck 601 and the separation wafer chuck 602, and the center of the circle is defined by axis of rotation of the rotary track 604. In FIG. 6, the rotary track 604 rotates clockwise to move the planarization chuck 601, the separation chuck 602, and the superstrate chuck 603 to different zones.

Figure 7A:
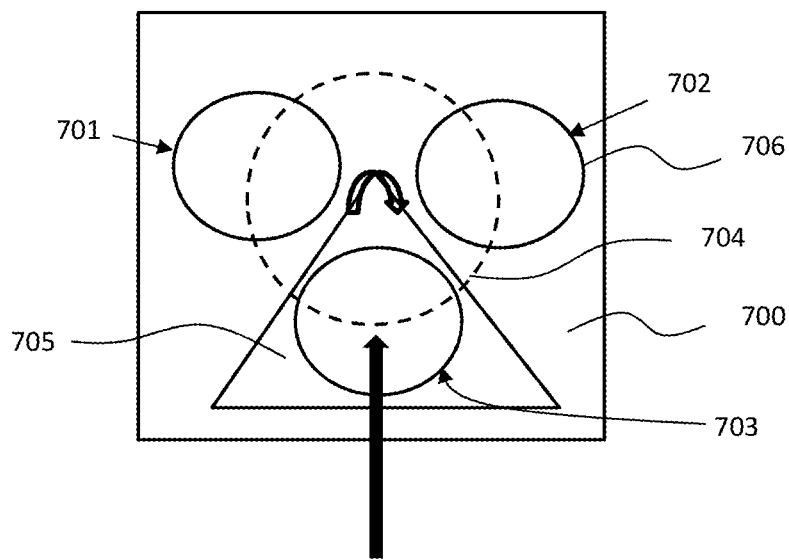
FIG. 7A to 7C shows the positions of the planarization wafer chuck and the separation wafer chuck for planarization and separation operations.
Figure 7B:
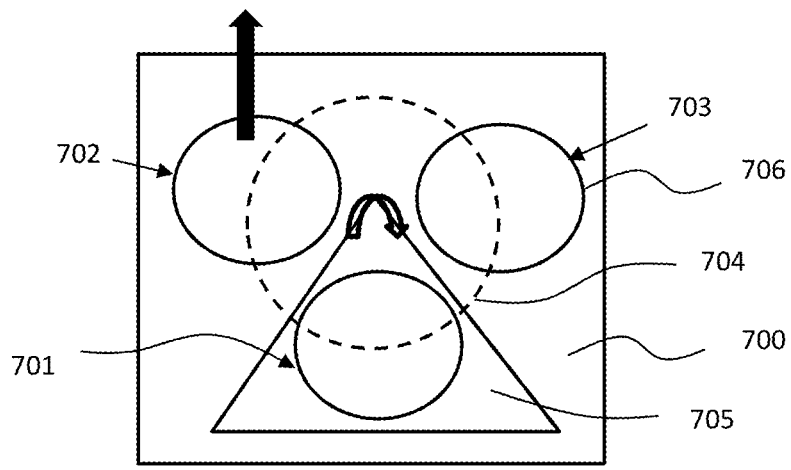
Figure 7C:
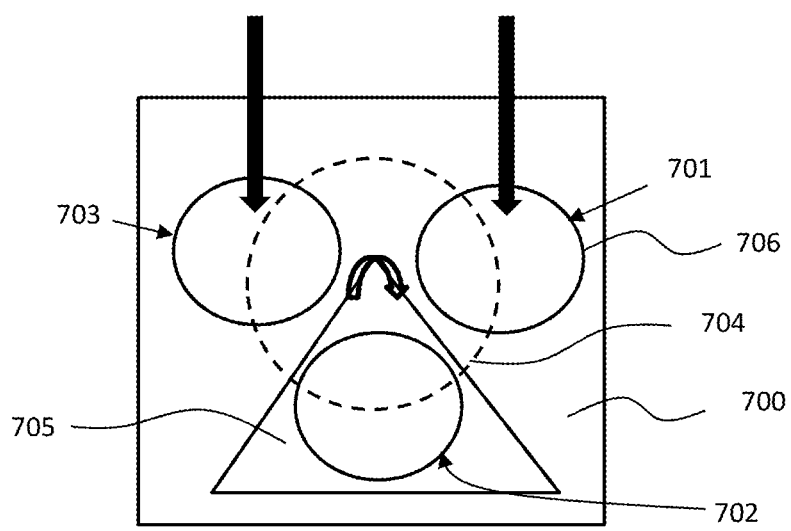

FIGS. 7A to 7C are top views showing a three-position rotary stage base 700 for supporting the planarization wafer chuck 701 and the separation wafer chuck 702. The rotary stage base 700 may include a rotary dish 704 for loading a wafer onto the planarization chuck 701, a sandwich onto the separation chuck 702, and a superstrate chuck loading station 703 at three zones along the periphery of the rotary dish 704. As the rotary track 704 rotates, the planarization chuck 701, the separation chuck 702, and the superstrate chuck loading station 703 moves from one zone to next zone. In one embodiment, an equilateral triangle is defined on the plane where the planarization chuck 701, the separation chuck 702, and the superstrate chuck loading station 703 are arranged. The planarization chuck 701, the separation chuck 702, and the superstrate chuck loading station 703 may be arranged at three respective corners of the triangle. That is, the planarization chuck 701, the separation chuck 702, and the superstrate chuck loading station 703 may be spaced relative to each other by 120° about a central axis of the triangle. In FIG. 7A, in an embodiment the planarization head is fixed and the superstrate loading station 703 (which may include a superstrate loading chuck) is moved to be below the planarization head 705. In the embodiment as shown in FIG. 7A, the optional UV LED source 706 is located in one of the zones without the planarization head. Although FIGS. 7A to 7B show the clockwise rotations of the planarization chuck 701, the separation chuck 702, and the superstrate chuck loading station 703, it is appreciated that the rotary track 704 may also rotate counterclockwise, and a UV source may also be installed in the same zone as the planarization head 705. In FIG. 7B, the planarization chuck 705 is rotated under the planarization head PH for spreading the formable material applied on a wafer retained by the planarization chuck 705 so as to form a formable material film. Curing of the formable material film may be performed with a curing source installed in the planarization head PH to form a planarized layer. The planarization chuck 701 may be rotated under the optional UV source 706 to perform optional UV exposure on the planarized layer. After curing, the planarization chuck 701 may be rotated under the planarization head PH. After curing the planarization head PH may be used to remove the sandwich from the planarization chuck 701 and retain the sandwich. In FIG. 7C, the separation chuck 702 is rotated under planarization head PH to perform separation of the superstrate from the planarized layer during the planarization process. After the separation chuck 702 has moved under the planarization head PH, the separation chuck 702 and the planarization head PH are used together to remove the superstrate form the sandwich. The planarized wafer may then be removed from the separation chuck. The removal of the planarized wafer may be done after the separation chuck moves away from the planarization head PH.

Figure 8:
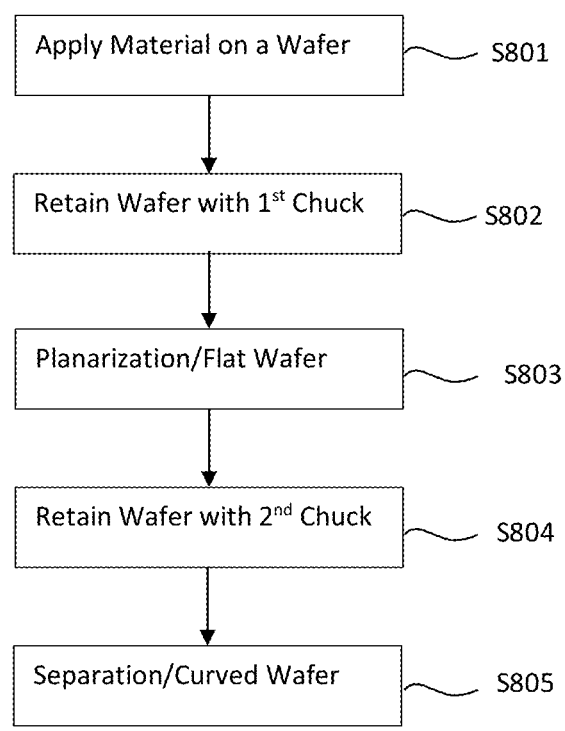
FIG. 8 is a flow chart of a method for manufacturing an article.

FIG. 8 shows a method of manufacturing an article using different wafer chucks for planarization and separation as discussed above. In step S801, a formable material is applied on a wafer. The wafer with the formable material is retained with a first wafer chuck in step S802. Step S801 maybe performed before or while the first wafer chuck retains the wafer in step S802. Planarization is performed on the wafer retained by the first wafer chuck in step S803. Prior to step S803 a superstrate is loaded onto the superstrate chuck attached to the planarization head. Also prior to step S803, the first wafer chuck is positioned to be under the planarization head. During planarization, the wafer retained by the first wafer chuck is maintained in a flat state. During step S803 the superstrate is brought into contact with formable material on the wafer held by the first chuck which starts spread of the formable material. During step S803 the superstrate chuck may release the superstrate so that it is resting on the formable material to form a sandwich (wafer; formable material, superstrate) on the first wafer chuck. During step S803 formable material is cured, this may occur by exposing the formable material to UV radiation while the sandwich is on the first wafer chuck after the formable material has spread. The curing substantially stops the spread of the formable material. During curing the sandwich is on the first wafer chuck and may be under the planarization head. Prior to curing the first wafer chuck may be moved from underneath the planarization head to a curing zone. After curing the first wafer chuck with the sandwich may be moved to be underneath the planarization head. The planarization head may then be used to remove the sandwich from first wafer chuck. The first wafer chuck may then be moved away from the planarization head and a second wafer chuck may be brought underneath the planarization head. In step S804, the sandwich is retained with a second wafer chuck. During step S804 the planarization head may be used position the sandwich onto second wafer chuck. The second wafer chuck is different from the first wafer chuck. Separation is performed while the wafer held by the second wafer chuck bends and/or causes a curvature of the wafer and/or sandwich in step S805. The planarization head may be used during step S805 along with the second chuck to separate the superstrate from the cured formable material on the wafer. The second wafer chuck may be moved away from the planarization head after separation to an unloading station where the planarized wafer is removed from the second wafer chuck.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A planarization system comprising:
   a first substrate chuck configured to hold a substrate during a planarization step; and
   a second substrate chuck configured to hold the substrate with a radially symmetric non-flat configuration around a center of the second substrate chuck during a separation step,
   wherein the second substrate chuck is more flexible than the first substrate chuck.

2. The planarization system of claim 1, wherein the first substrate chuck has a plurality of contact points to be in contact with a wafer to be held by the first substrate chuck.

3. The planarization system of claim 2, wherein the first substrate chuck has a global flatness no larger than 50 nm across the plurality of contact points.

4. The planarization system of claim 1, wherein the first substrate chuck is configured to maintain a flatness of the wafer while minimizing backside contact area during the planarization step.

5. The planarization system of claim 1, wherein the first substrate chuck is made of $Al_2O_3$, SiC, Sapphire, or other ceramic materials.

6. The planarization system of claim 1, wherein the second substrate chuck is made of a compliant material.

7. The planarization system of claim 1, wherein the first substrate chuck has a diameter no smaller than a diameter of the wafer to support the wafer from edge to edge during planarization.

8. The planarization system of claim 1, wherein the second substrate chuck has a diameter smaller than a diameter of the wafer.

9. The planarization system of claim 1, the second substrate chuck is configured to maximize a holding force at an edge of the wafer during the separation step.

10. The planarization system of claim 1, wherein the second wafer chuck includes a predetermined number of pins and lands, and each of the pins and lands has a geometry and a surface area predetermined for separation.

11. The planarization system of claim 1, wherein the second substrate chuck has a dome shape.

12. The planarization system of claim 1, further comprising a rotary stage on which the first substrate chuck and the second substrate chuck rotate to align with a planarization head, respectively.

13. The planarization system of claim 1, further comprising a three-position rotary stage configured to carry and rotate the first substrate chuck and the second substrate chuck on a plane.

14. The planarization system of claim 13, wherein the first substrate chuck, the second substrate chuck, and a superstrate loading station are arranged in a triangle on the plane.

15. The planarization system of claim 1, further comprising a linear stage on which the first substrate chuck and the second substrate chuck move linearly to align with the planarization head, respectively.

16. A planarization system comprising:
a first substrate chuck configured to hold a substrate during a planarization step;
a second substrate chuck configured to hold the substrate with a non-flat configuration during a separation step; and
a rotary stage on which the first substrate chuck and the second substrate chuck rotate to align with a planarization head, respectively.

17. The planarization system of claim 16, wherein the second substrate chuck has a thickness largest at a center thereof and thinnest at a periphery thereof.

18. The planarization system of claim 16, wherein the second substrate chuck has a surface to be in contact with the wafer, the surface has a sequence of steps with gradually decreasing heights from a center of the second substrate chuck.

19. The planarization system of claim 16, wherein the second substrate chuck includes a recessed center, a first land, a recessed ring, and a second land arranged from a center to a periphery thereof.

20. A method comprising:
holding a substrate on a first substrate chuck,
bringing a material on the substrate held by the first substrate chuck into contact with a planarization plate,
moving the substrate and the planarization plate contacting with each other to a second substrate chuck from the first substrate chuck, and
separating the planarization plate from the material on the substrate held by the second substrate chuck,
wherein the separating includes holding the substrate with the second substrate chuck such that the second substrate chuck has a radially symmetric non-flat configuration around a center of the second substrate chuck, and
wherein the second substrate chuck is more flexible than the first substrate chuck.

21. The method of claim 20, further comprising holding another substrate on the first substrate chuck during the moving or the separating.

22. A method of manufacturing an article, comprising:
holding a substrate on a first substrate chuck,
bringing a material on the substrate held by the first substrate chuck into contact with a planarization plate,
moving the substrate and the planarization plate contacting with each other to a second substrate chuck from the first substrate chuck,
separating the planarization plate from the material on the substrate held by the second substrate chuck, and
manufacturing the article by processing the substrate,
wherein the separating includes holding the substrate with the second substrate chuck such that the second substrate chuck has a radially symmetric non-flat configuration around a center of the second substrate chuck, and
wherein the second substrate chuck is more flexible than the first substrate chuck.

* * * * *